(12) United States Patent
Pey et al.

(10) Patent No.: US 6,180,501 B1
(45) Date of Patent: Jan. 30, 2001

(54) METHOD TO FABRICATE A DOUBLE-POLYSILICON GATE STRUCTURE FOR A SUB-QUARTER MICRON SELF-ALIGNED-TITANIUM SILICIDE PROCESS

(75) Inventors: Kin-Leong Pey; Chaw Sing Ho, both of Singapore (SG); Lap Chan, San Francisco, CA (US)

(73) Assignees: Chartered Semiconductor Manufacturing Ltd.; National University of Singapore, both of Singapore (SG)

( * ) Notice: Under 35 U.S.C. 154(b), the term of this patent shall be extended for 0 days.

(21) Appl. No.: 09/418,036

(22) Filed: Oct. 14, 1999

(51) Int. Cl.$^7$ ............................................... H01L 21/3205
(52) U.S. Cl. ......................... 438/592; 438/299; 438/303; 438/652; 438/657
(58) Field of Search ..................... 438/182, 199, 438/283, 286, 299, 303, 586, 587, 588, 592, 595, 652, 657, 648, 649

(56) References Cited

U.S. PATENT DOCUMENTS

| 5,196,357 | 3/1993 | Boardman et al. ..................... 437/40 |
| 5,688,704 | 11/1997 | Liu ......................................... 437/41 |
| 5,731,239 | 3/1998 | Wong et al. .......................... 438/296 |
| 5,856,225 | * 1/1999 | Lee et al. .............................. 438/291 |
| 5,966,597 | * 10/1999 | Wright .................................. 438/197 |
| 6,060,387 | * 5/2000 | Shepela et al. ....................... 438/630 |
| 6,093,628 | * 7/2000 | Lim et al. ............................. 438/592 |
| 6,096,643 | * 1/1999 | Nariman et al. ...................... 438/666 |

* cited by examiner

Primary Examiner—Charles Bowers
Assistant Examiner—Jack Chen
(74) Attorney, Agent, or Firm—George O. Saile; Rosemary L.S. Pike (57) ABSTRACT

This invention relates to the fabrication of integrated circuit devices and more particularly to a method for minimizing the localized mechanical stress problems that can occur when silicided polysilicon gates are used to fabricate narrow channel CMOS devices. The invention addresses the avoidance of typical stress-induced problems in polysilicon gates, such as non-uniform silicide (including bowing, thinning edges, etc.) and voids, which are becoming increasingly worse as gate lengths continue to be reduced. The key to this invention is to spread the highly detrimental mechanical stresses, in narrow silicided gates, over a larger vertical surface area. This is accomplished by using a thin/thick double polysilicon stack for the gate, whereby, the lower thin polysilicon gate layer is not silicided and the upper thick polysilicon layer is subsequently silicided. An insulating layer is used to prevent silicidation of the lower thin polysilicon gate, during silicidation of active source-drain regions. The same insulating layer is also used to avoid another cause of mechanical stress, by protecting the surface grain boundaries of the lower thin polysilicon gate layer from being stuffed with polymer during the dry etching used for spacer formation. The tall stacked gate structure allows the silicide-induced stresses to be more safely located farther away from the active devices.

21 Claims, 8 Drawing Sheets

METHOD TO FABRICATE A DOUBLE-POLYSILICON GATE STRUCTURE FOR A SUB-QUARTER MICRON SELF-ALIGNED-TITANIUM SILICIDE PROCESS

FIELD OF THE INVENTION

This invention relates to the fabrication of integrated circuit devices and more particularly to a method for minimizing the localized mechanical stress problems that can occur when silicided polysilicon gates are used to fabricate narrow channel CMOS devices.

BACKGROUND OF THE INVENTION AND PRIOR ART

In order to meet higher and higher chip performance (speed) and density objectives, for the submicron era, increasing attention has been placed on interconnect technology. This concern applies to multilevel interconnects as well as to the more localized device connections and device interconnects, which are the subject of this invention. As device dimensions progress down into the sub-quarter-micron regime, the performance benefits of continued shrinkage will not be fully realized unless device contact resistance and local device interconnect line resistance is continually reduced. Historically, such reductions have resulted from innovative ways to lower the sheet resistance of doped polysilicon layers, while still retaining the benefits of polysilicon gates and local polysilicon lines. Some of the benefits of polysilicon layers have been and continue to be: (1) Well controlled FET device threshold voltages, when used as gate electrodes and (2) the ability to be readily oxidized for purposes of electrical insulation. However, since the advent of the sub-micron era, the interconnect delays, associated with polysilicon have become too large, relative to inherent device switching times. Accordingly, the industry has largely addressed this problem by using refractory metals (such as: Titanium, Ti, and Tungsten, W), in conjunction with polysilicon, in order to form silicide layers with resistivities at least 20 times lower than that of highly doped polysilicon. Currently, such silicide layers (polycides) are a basic building block in evolving implementations of the Self-Aligned Silicide (Salicide) Technology.

In a typical salicide device structure, a gate oxide layer and an overlying polysilicon layer are first patterned into gate regions. The gate regions are then covered by an overlying oxide layer and then subsequently etched back, anisotropically, in order to form exposed source-drain regions and exposed polysilicon gate regions that are self-aligned and laterally separated by rounded oxide spacers on both ends of the gate. Following an ion implantation step for doping the source-drain and polysilicon gate region, a blanket layer of Ti, for example, is deposited and then thermally reacted in order to form Titanium Silicide, $TiSi_2$, on gate and source-drain regions. The unreacted titanium, over the spacers, etc., is then chemically removed.

The above Ti-Salicide process, including Lightly Doped Drain (LDD), etc., derivatives thereof, has been a key driving force behind current manufacturing efforts for high-speed CMOS devices. To cite just a few reasons, it has been very successful, in terms of providing the low resistivity gate and source-drain regions needed for high, speed signal propagation, while retaining the very desirable threshold voltage control and oxidizable aspects of polysilicon.

However, this technology has run into problems as device dimensions have continued to shrink into the sub-quarter-micron range. For example, $TiSi_2$ exhibits a line width effect due to the kinetic restriction imposed on the C49-to-C54 phase transformation by shrinking polysilicon gate lengths. This results in increased gate sheet resistance as the gate length increases. The reason for this is that for the C54-polymorph as the C49-grain size becomes comparable with the gate lengths. These nucleation sites are essentially C49-$TiSi_2$ triple grain boundaries.

It has also been observed that as the gate length continues to shrink, the increased lateral stress due to the spacers on the narrow gates contributes to non-uniform silicide layers on the gates. In addition, voids have been observed in $TiSi_2$ films formed on highly $BF_2$-implanted polysilicon, presumably due to a combination of factors, such as: (1) Residual polymers resulting from nitride spacer effect etching, (2) Dopant effects, (3) line width effects and (4) Increased lateral stress on narrow gates. The present invention addresses these problems.

In addition to the above problems, addressed by the present invention, shrinking device dimensions have also resulted in a number of other problems that have been addressed in the prior art.

As device dimensions have continued to shrink, even the much lower sheet resistances of $TiSi_2$, relative to doped polysilicon, have become a performance limitation and this has necessitated additional innovation for further reductions in sheet resistance. It has been found that the sheet resistance of a silicide can be further reduced by using an ion implant process to amorphize the polysilicon layer, prior to forming $TiSi_2$. It has also been found that cobalt and nickel silicides can provide lower sheet resistances than that of Titanium silicide. However, such innovations have also been found to have their own problems, which have been addressed in the following patent by Wong, et. al.

U.S. Pat. No. 5,731,239, to Wong, et. al., teaches an improved and simplified method for lowering the sheet resistance of gate electrodes by means of a pre-amorphization ion implant, prior to titanium silicide formation, as well as by the use of cobalt silicide. A self aligned additional insulating layer is used to mask the source-drain regions during the ion implant process for pre-amorphization of the gate electrode. A Chemical Mechanical Polishing, CMP, process is used as part of the process to form the aforementioned self aligned insulator mask, which saves a photolithography step. This invention, however, does not address the above mentioned stress problems, associated with narrow salicide gates.

The conventional salicide process technology, described above, is also prone to so-called trenching problems that can become more severe as device dimensions get smaller. During the anisotropic etching that is used to form the polysilicon gate electrode, there is a risk of penetrating the surrounding thin gate oxide, where the source drain regions will eventually be formed.

U.S. Pat. No. 5,688,704, to Liu, teaches a method to avoid the above trenching problem. A T-shaped polysilicon gate is used, whereby the outer winged-portion of the T-shaped gate is resting on a thick insulator. Therefore, the underlying surface is well protected during a subsequent anisotropic etch back step which forms the gate. During the same etch back step, rectangular spacers are formed under the winged edges of the T-shaped gate. These rectangular spacers help to prevent bridging between the gate and source-drain regions after the eventual silicide formation step. Since the T-shaped gate has more relative vertical and lateral surface area for salicidation, it should help to reduce stress. However, the increased device area required for T-shaped gates is not compatible with shrinking design rules for most sub-quarter-micron needs.

U.S. Pat. No. 5,196,357, to Boardman, et. al., also teaches a method for improving the performance and reliability of CMOS FET devices, using Self-Aligned Silicide (Salicide) Technology. As in the case of the above patent, to Liu, the concern over plasma etch damage to surrounding source-drain regions, during the conventional formation of the polysilicon gate electrode, is addressed. Also, similar to the above patent, to Liu, a T-shaped gate is also used. Again, the greater vertical and lateral surface area of the T-shaped gate would tend to reduce the stress problems addressed by the present patent but the associated increased device area would not be compatible with shrinking design ground rules.

SUMMARY OF THE INVENTION

A principle objective of the present invention is to provide an effective and manufacturable method to fabricate a double polysilicon gate structure, for a sub-quarter micron self aligned titanium silicide process, over a semiconductor substrate.

Another objective of the present invention is to provide an improved method to vertically increase the polysilicon gate surface area, for salicidation, in order to provide an improved method to solve the difficulty of non-uniform silicide on narrow silicided polysilicon gates.

Another objective of the present invention is to provide a method for also minimizing the lateral stress of a silicided polysilicon gate, by means of using a double polysilicon process for increasing the vertical area of the gate electrode for silicidation.

A further objective of the invention is to decouple the source/drain implant and gate implant. The need for the ultra-shallow junctions results in very low-energy implants, which may lead to poly-gate depletion effects. This is especially true for the sub-quarter micron generation of CMOS devices.

These objectives are achieved by a fabrication method for minimizing mechanical stress in narrow channel self-aligned-silicided FET devices, comprising the steps of: (a) depositing an insulator on a polysilicon gate layer for the purpose of temporarily protecting the polysilicon surface during some early process operations, where the polysilicon surface would normally be exposed; (b) using an insulating layer to protect the surface of a polysilicon gate during a dry etching step to form spacers; (c) using an insulating layer to prevent the silicidation of polysilicon gates, during the silicidation of source-drain regions; (d) forming a second polysilicon gate on top of a first polysilicon gate; (e) only performing silicidation on the upper polysilicon layer of the double polysilicon stack; and (f) depositing an interlevel dielectric, followed by via holes and contacting studs down to the source-drain and gate regions of the completed device.

The present invention provides a method for solving the problem of non-uniform silicides and lateral stress, associated with forming narrow silicided polysilicon gates. If the vertical gate surface area is relatively small, as in the case of conventional self aligned silicided polysilicon gate FET devices, the stress gradients between juxtaposed silicide and polysilicon regions as well as juxtaposed gate and spacer regions can become excessive, particularly for the case of sub-quarter-micron gates. Most dielectric films used for spacer applications are deposited with compressive stress, to minimize film delamination. Therefore, as a result, the spacer will always exert a compressive stress onto the polysilicon gate. Using the second poly layer, without a spacer, will eliminate this spacer induced sidewall stress.

In addition, this invention also provides a method to solve the polysilicon gate depletion effects, due to the low energy implants required for ultra-shallow junction formation, by decoupling the gate and source-drain implants.

The present invention solves the above problems by, primarily, increasing the vertical surface area of the polysilicon gate electrode. This is accomplished by a new method to fabricate a double polysilicon gate structure. This new method features: (1) No spacer induced stress for the top silicon gate, (2) A pre-amorphization implant for reduced silicide sheet resistance, (3) The ability to increase the lateral surface area, as well, by using an optional T-shaped second polysilicon gate layer, (5) Silicidation of only the top of the second polysilicon gate layer, for stress reduction, (6) Decoupling of the source/drain implant from the gate implant and (7) Implanting the second polysilicon gate layer with the inter-level dielectric film acting as a self-aligned insulating mask, to protect the source-drain regions from the higher-energy gate implants used to dope the gates degenerately.

BRIEF DESCRIPTION OF THE DRAWINGS

In the accompanying drawings for a material part of this description, there is shown:

FIGS. 1 to 11 and FIGS. 12a to 15a and 16 schematically illustrate in cross-sectional representation a preferred embodiment of the process of the present invention, which features a relatively high stud shaped second polysilicon gate electrode.

FIGS. 12b to 15b schematically illustrate in cross-sectional representation an alternative preferred embodiment of the process of the present invention, which features a T-shaped second polysilicon gate electrode.

FIGS. 12c to 14c schematically illustrate in cross-sectional representation an additional alternative preferred embodiment of the process of the present invention, which features a simplified CMP endpoint-related means for the definition and the self-aligned silicidation of a relatively short stud-shaped second polysilicon gate electrode.

DESCRIPTION OF THE PREFERRED EMBODIMENTS

Figure 1:
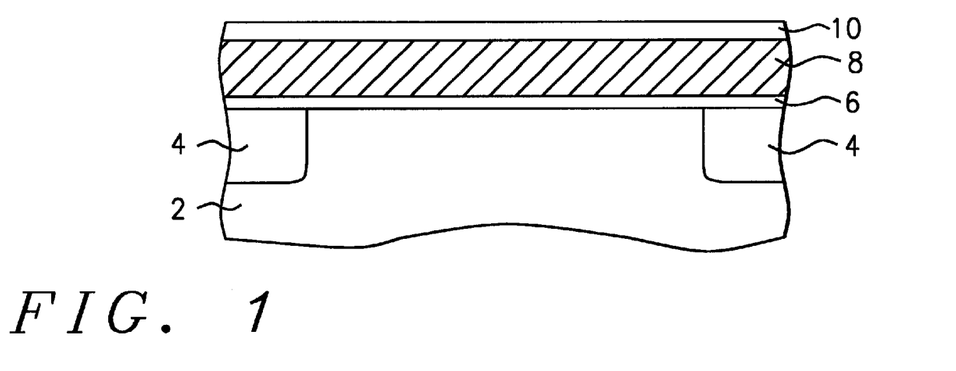

It is noted that the following preferred embodiments and associated figures will be presented in a way that can be generically applied to the fabrication of both the N channel and the P channel devices on a CMOS integrated circuit chip. Referring now more particularly to FIG. 1, there is shown a portion of a partially completed integrated circuit. There is shown a semiconductor substrate 2 intended to represent a conventional ion implanted N well or P well region, in which an eventual CMOS narrow channel FET will be formed. Also shown in the sub-surface region of said substrate 2 are the Shallow Trench Isolation, STI, regions 4 that will be used to electrically isolate said eventual FET. Referring to FIG. 1, an overlying stack consisting of a gate oxide layer 6, an overlying first polysilicon layer 8, and a still further overlying silicon nitride layer 10 is then formed. Said gate oxide 6 is a thin thermal oxide, with a typical thickness range of about 25 to 30 angstroms, that is subsequently nitrided. A preferred gate oxide thickness of about 40 angstroms is grown in a dry followed by a partial wet ambient, at a typical temperature range of about 800 to 1000 degrees centigrade for a duration of about 1 to 3 minutes. Said subsequent nitridation process can be performed at a temperature range of about 900 to 1000 degrees centigrade, in a nitrous oxide ($N_2O$) ambient, using an RTA.

Still referring to FIG. 1, said first polysilicon layer 8 is preferably deposited, by means of Low Pressure Chemical Vapor Deposition, LPCVD, to a typical thickness range of about 1400 to 2500 angstroms, with a preferred thickness of about 1500 angstroms.

Continuing to refer to FIG. 1, said overlying silicon nitride layer 10 is typically grown to a thickness of about 450 to 550 angstroms, with a preferred thickness of about 500 angstroms. Said nitride layer 10 is typically thermally grown on said underlying first polysilicon layer 8 by means of an LPCVD process.

Figure 2:
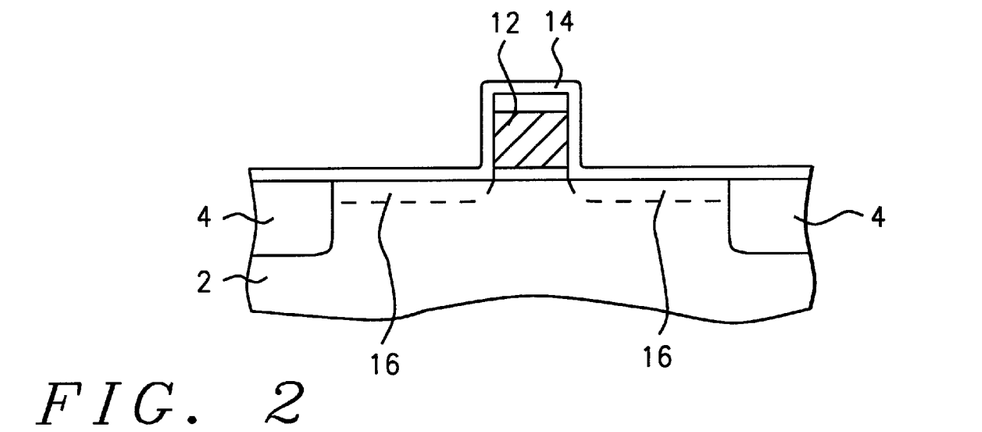

Referring now more particularly to FIG. 2, conventional masking and plasma etching is now performed on said stack, consisting of said nitride layer 10, said first polysilicon layer 8 and said gate oxide layer 6, in order to form first polysilicon gate 12. The gate oxide acts as an etch stop, after which a cleaning step is used to remove the remaining oxide from the active regions. A Bromine based (HBr) plasma etching chemistry is typically used to form said first polysilicon gate 12. An overlying thin TEOS, $SiO_2$ liner 14 is then blanket deposited to a thickness of about 150 angstroms, to reduce overlap capacitance. At this stage Low Doped Drain, LDD, regions 16 are formed, by means of conventional masking and ion implantation processing.

Figure 3:
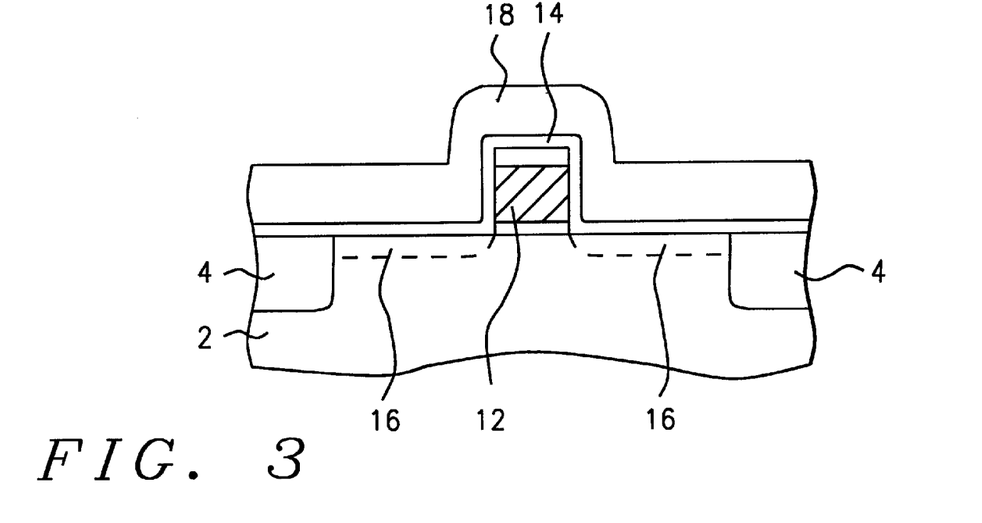

Referring now more particularly to FIG. 3, an overlying silicon nitride layer 18 is deposited to a typical thickness of about 1200 to 1500 angstroms. Said overlying $Si_xN_y$ layer will be used for eventual spacer formation as well as for a protective capping layer that will prevent eventual silicidation of said first polysilicon 12.

Figure 4:
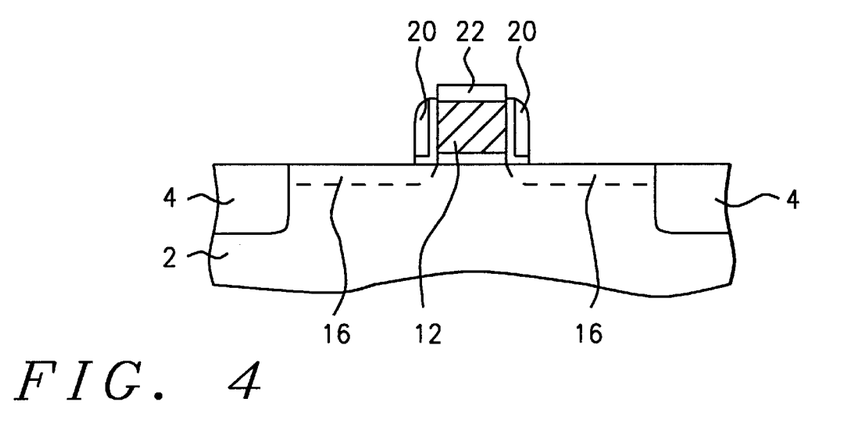

Referring now more particularly to FIG. 4, plasma etching is used to form the aforementioned nitride spacers, 20 as well as the aforementioned nitride cap 22 on top of said first polysilicon gate feature 12. Said spacers 20 are preferably formed, using either a conventional Transformer Coupled Plasma (TCP) etch process or a conventional Reactive Ion Etch (RIE) anisotropic etching process. It is noted that the thickness of said resultant silicon nitride cap layer 22 is typically in the range of 320 to 380 angstroms with a preferred thickness of about 350 angstroms. It is also noted, that said resultant spacers 20 will be relatively small, since the thickness of said first polysilicon gate 12 is relatively thin. This is purposely done in order to increase the active area of the eventual source-drain regions for salicidation, especially for areas where the poly-to-poly spacing is very small, i.e. less than 0.34 um.

Figure 5:
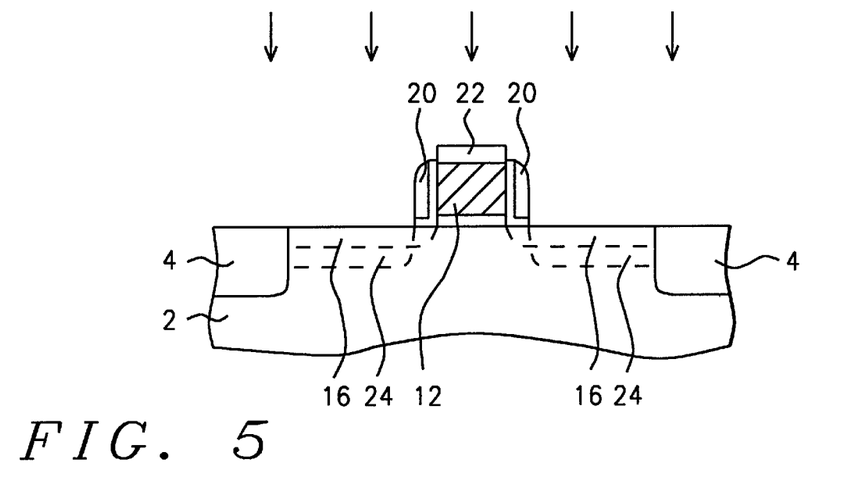

Referring now more particularly to FIG. 5, conventional blanket ion implantation processing, including thermal activation by means of RTA, is then used to form the highly doped source-drain regions 24. A typical arsenic dose of about 3E15 at/$cm^2$ is used for the N channel devices and a typical boron dose of about 3.5E15 at/$cm^2$ is used for the P channel devices. After said source-drain implants have been annealed a blanket pre-amorphization implant step (not shown) is performed, in order to promote a lower sheet resistance for said source-drain regions 24, after subsequent silicidation. Typically, either a 14 KeV silicon dose of about 6E14 at/$cm^2$ or a 20 KeV germanium dose of about 3E14 at/$cm^2$ is used for said pre-amorphization step.

Figure 6:
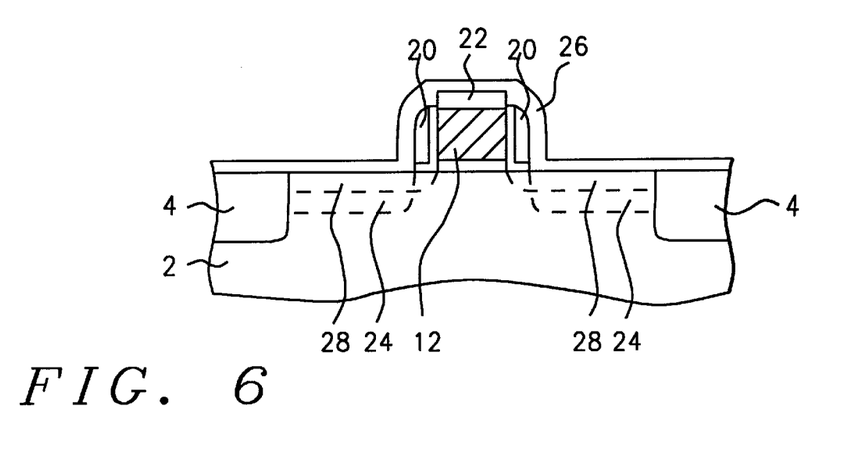

Referring now more particularly to FIG. 6, a blanket Titanium/Titanium Nitride (Ti/TiN) stack 26 is then deposited, in preparation for the eventual salicidation of the active source-drain regions 28. The respective thickness ranges of said Ti/TiN stack 26 are typically about 280 to 350 angstroms for the Ti and about 200 to 250 angstroms for the TiN, with a preferred thickness of about 300 angstroms for the Ti and about 250 angstroms for the TiN. It is noted that the preferred thickness of said Ti/TiN stack 26 is optimized for the ultra shallow depth, of about 0.1 microns, for said source-drain regions 24.

Figure 7:
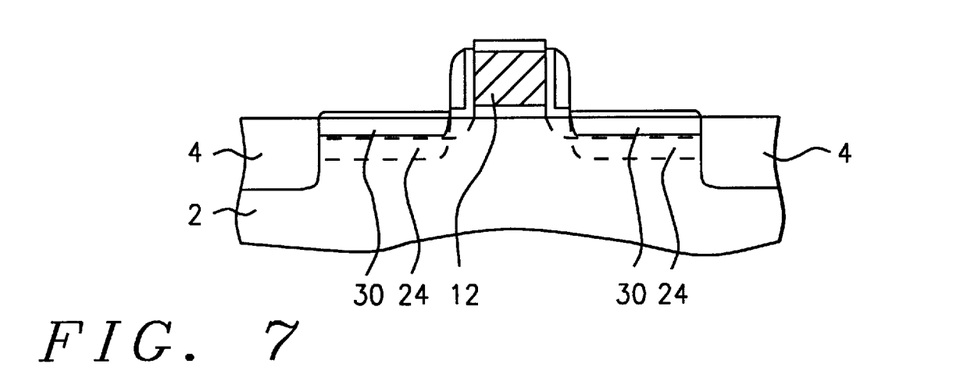

Referring now more particularly to FIG. 7, a standard silicide process is then carried out. For the thermal formation of Titanium Silicide ($TiSi_2$) regions 30, a two stage Rapid Thermal Process (RTP) anneal is used. The first RTP anneal step is carried out at a temperature of about 720–750 degrees centigrade and for a time of about 20 to 60 seconds. After a selective chemical etch back of the remaining unreacted portion of said Ti/TiN layer 26, the second RTP anneal step is then carried out at temperature of about 850 degrees centigrade and for a time of about 10 to 30 seconds. Said chemical etch back between the two aforementioned RTP steps, is performed with a 1:1:5 mixture of ammonia peroxide, at a bath temperature of about 55 degrees centigrade and for a time of about 250 seconds. Continuing to refer to FIG. 7, it is, again, noted that because of said silicon nitride cap 22 on the surface of said first polysilicon gate feature, no silicide is formed on the surface of said polysilicon gate feature 12.

Figure 8:
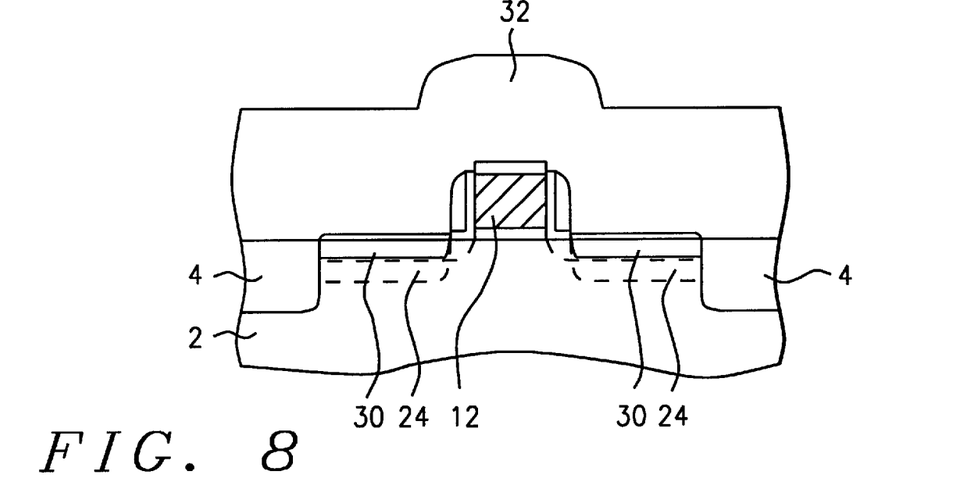

Referring now more particularly to FIG. 8, a thin undoped overlying dielectric layer (not shown) is then deposited, for the purpose of acting as a buffer layer between said exposed, silicided, active source-drain regions 30 and a subsequent thick, undoped LPCVD TEOS or Sub-Atmospheric Boro-Phophosilicate Glass, SABPSG dielectric layer, which immediately follows. Still referring to FIG. 8, said thick doped dielectric layer 32 is now deposited to a typical thickness of about 8,000 to 12,000 angstroms, preferably to a thickness of about 10,000 angstroms, and then thermally densified.

Figure 9:
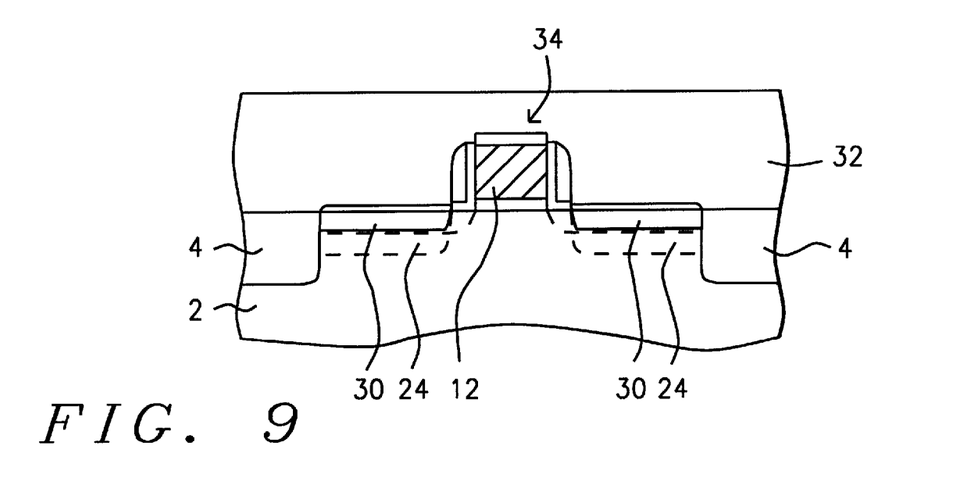

Referring now more particularly to FIG. 9, said thick doped insulating layer 32, is then planarized by means of Chemical Mechanical Polishing (CMP). After CMP, is it noted that the thickness of remaining doped oxide in region 34, immediately above the surface of said first polysilicon gate 12, is typically about 400 to 600 angstroms and more preferably about 500 angstroms.

Figure 10:
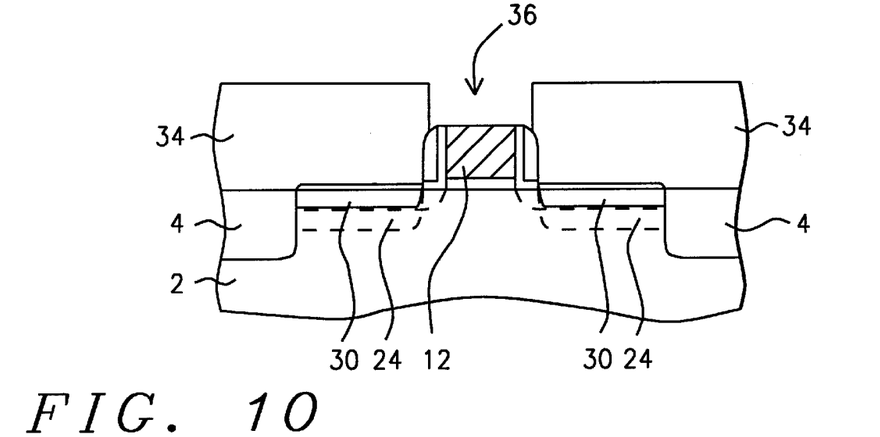

Referring now more particularly to FIG. 10, conventional masking and conventional plasma etching is then used to define a contact hole 36, in doped oxide region 34, down to the top surface of first polysilicon gate 12. The remainder of the protective nitride cap, which prevented silicidation of first polysilicon gate 12, is also removed, by plasma etching, as shown in FIG. 10.

Figure 11:
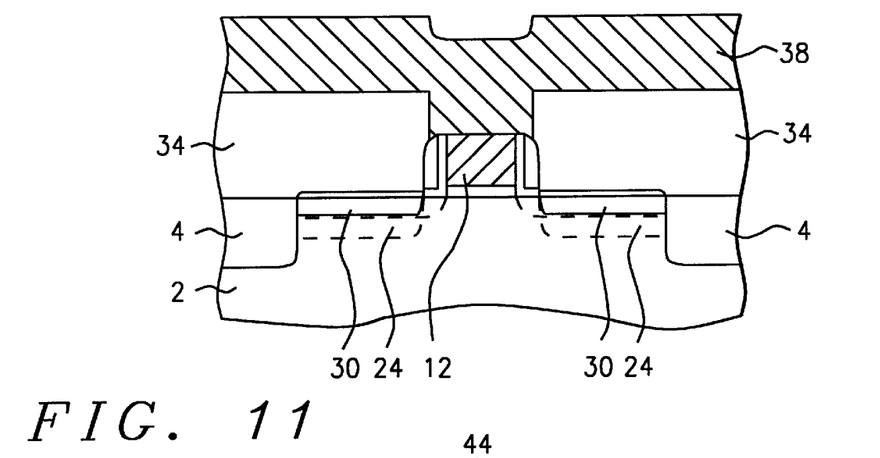

Referring now more particularly to FIG. 11, a blanket conformal polysilicon or amorphous silicon layer 38 is deposited, in preparation for extending the vertical surface area of said first silicon gate 12. Either LPCVD polysilicon or amorphous silicon can be deposited for the purpose of forming said layer 38. The deposition thickness range for said second polysilicon or amorphous silicon layer 38 is typically about 2000 to 3000 angstroms and more preferably about 2500 angstroms. The deposition temperature range for said polysilicon or amorphous silicon layer 38 is, respectively, about 625 degrees centigrade and 560 to 590 degrees centigrade. Said polysilicon process is preferred over said amorphous silicon process, for higher process throughput, during the formation of said layer 38. Therefore, for the purposes of discussion, from this point forward, said layer 38 will be referred to as second polysilicon layer 38. Next, a CMP process step (not shown) is used to planarize said second polysilicon layer 38, after which, a positive photoresist layer (also not shown) is deposited in preparation for defining a second polysilicon gate, as a vertical extension of said first polysilicon gate 12. Timing is, typically, used to control the endpoint of the above CMP planarization process for said second polysilicon layer 38, where the thickness of polysilicon material removed is about 1800 to 2100 angstroms. As an alternative variation of said CMP planarization process, it is noted that said thick dielectric layer 32 (as shown in FIG. 11) can be used as the etch stopper for said CMP planarization process. By stopping on the surface of said dielectric layer 32, said alternative CMP process would not leave a blanket residual layer of said second polysilicon layer. Consequently, said positive photoresist layer (not shown) for defining said second polysilicon gate region would not be needed.

Figure 12A:
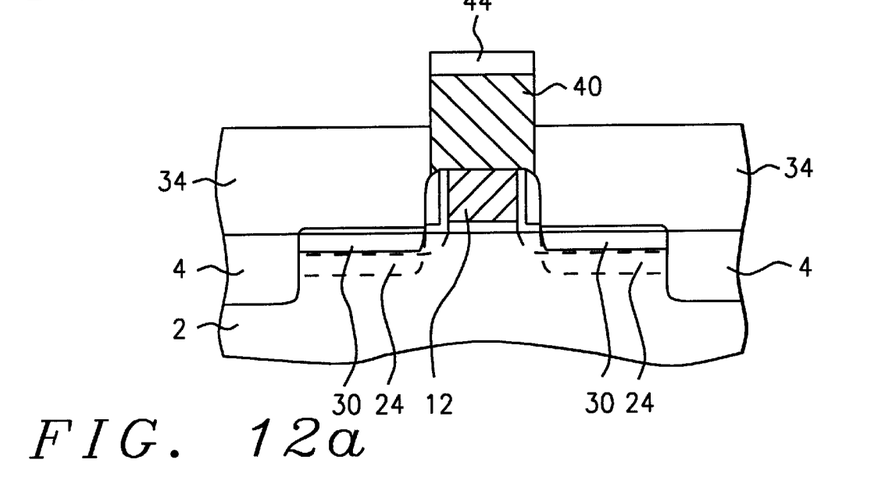
Figure 12B:
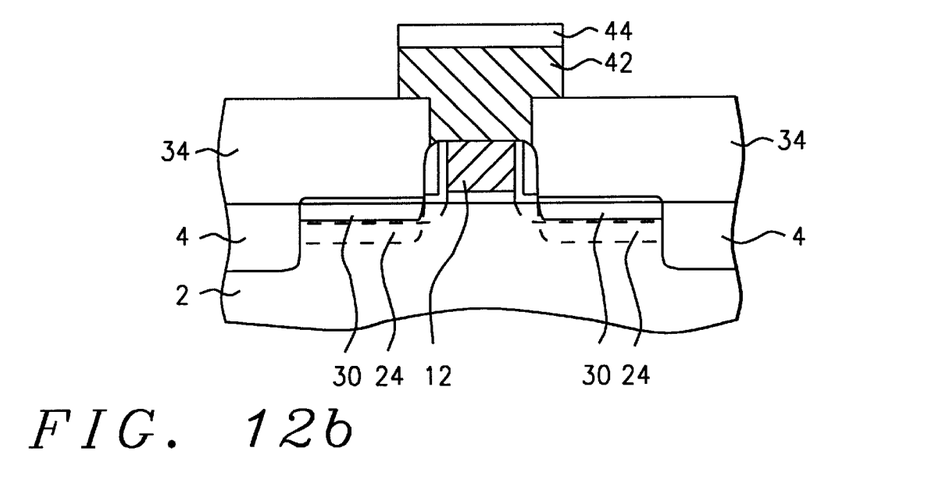
Figure 12C:
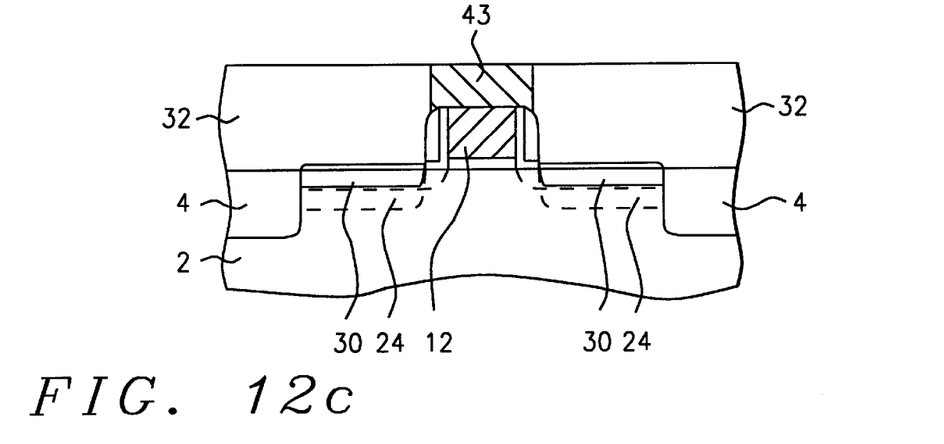

Referring now more particularly to FIGS. 12a, 12b, and 12c, these figures are the beginning of three sequential sets of figures that will be used to illustrate three preferred embodiments for said second polysilicon gate that will be used as a vertical extension of said first polysilicon gate 12. FIG. 12a shows a relatively high stud-shaped second polysilicon gate 40 and FIG. 12b shows a T-shaped second polysilicon gate 42. FIG. 12c shows a relatively short stud-shaped second polysilicon gate 43, resulting from said alternative CMP planarization step which proceeded all the way through said second polysilicon layer 38 (of FIG. 11) until being stopped by the surface of said thick dielectric layer 32. The series of remaining figures associated with FIG. 12a and subscripted with the letter, a, will be used to illustrate the stud-shaped second polysilicon gate preferred embodiment. Likewise, FIG. 12b and the remaining series of figures that are subscripted with the letter, b, will be used to illustrate the T-shaped second polysilicon gate preferred embodiment. The series of subsequent figures associated with FIG. 12c will be discussed after said subsequent series of figures, associated with FIGS. 12a and 12b have been discussed.

Referring once more to FIGS. 12a and 12b, a second polysilicon gate is defined by photoresist masking feature 44, from a conventional masking operation, and a subsequent conventional plasma etching step. For defining the stud-shaped second polysilicon gate 40, the same reticle is used, that was used to define first polysilicon gate 12. For the T-shaped second polysilicon gate 42, an additional reticle will be needed. Said T-shaped second polysilicon gate has the advantage of both increased vertical and horizontal area, for minimizing the polysilicon linewidth effect during silicidation.

Figure 13A:
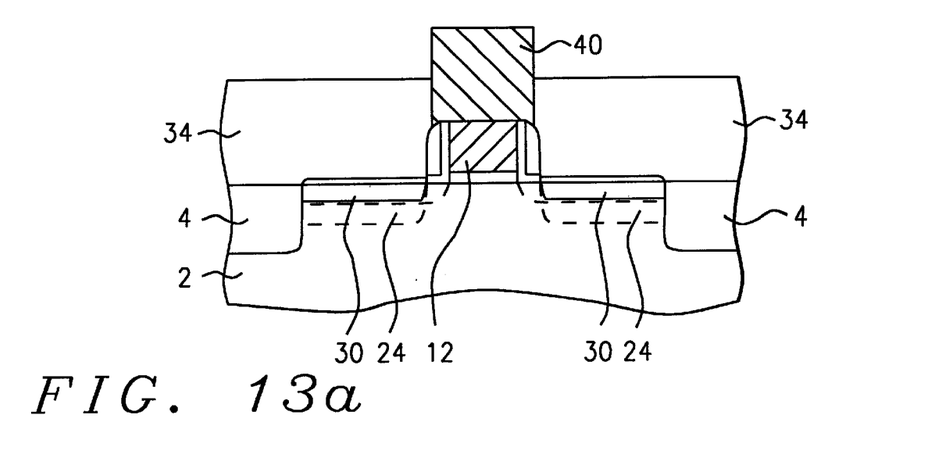
Figure 13B:
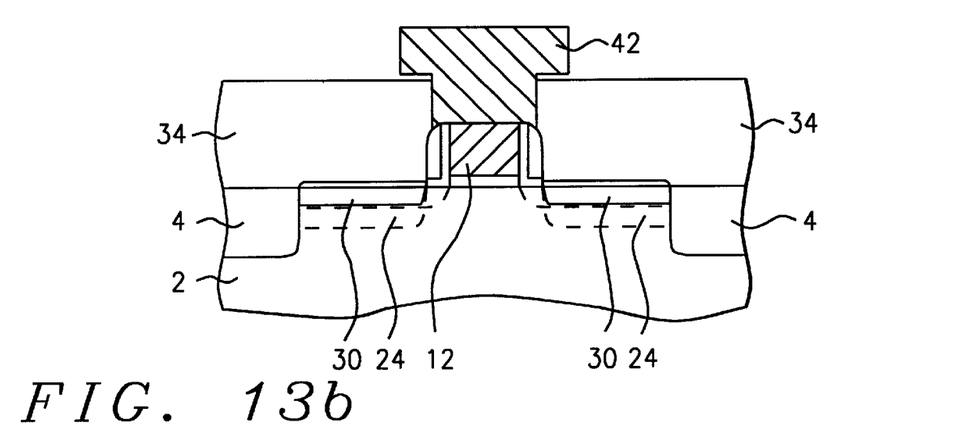

Referring now more particularly to FIGS. 13a and 13b, said photoresist features 44 are stripped off by conventional means and a subsequent conventional blanket gate ion implant process is performed into said second polysilicon gates, 40 and 42, in order to ensure that the polysilicon gates are doped degenerately and to prevent doping depletion into underlying first polysilicon gates 12.

Figure 14A:
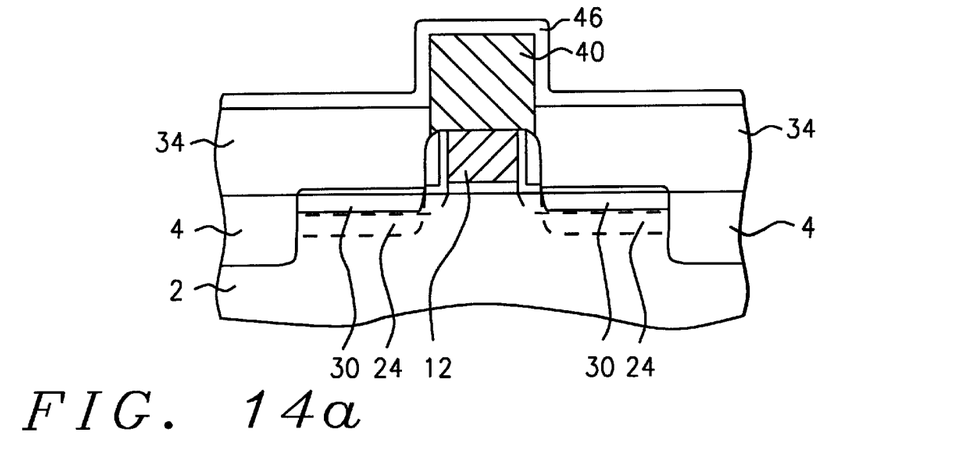
Figure 14B:
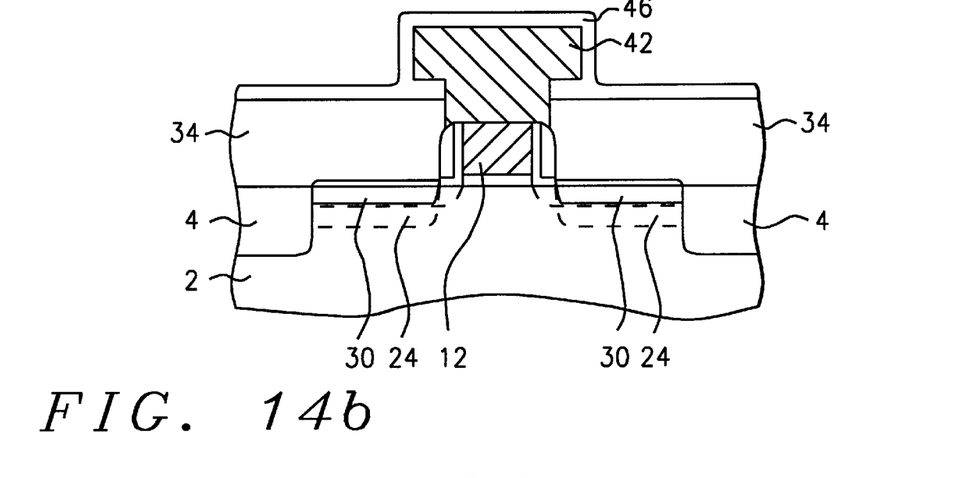
Figure 14C:
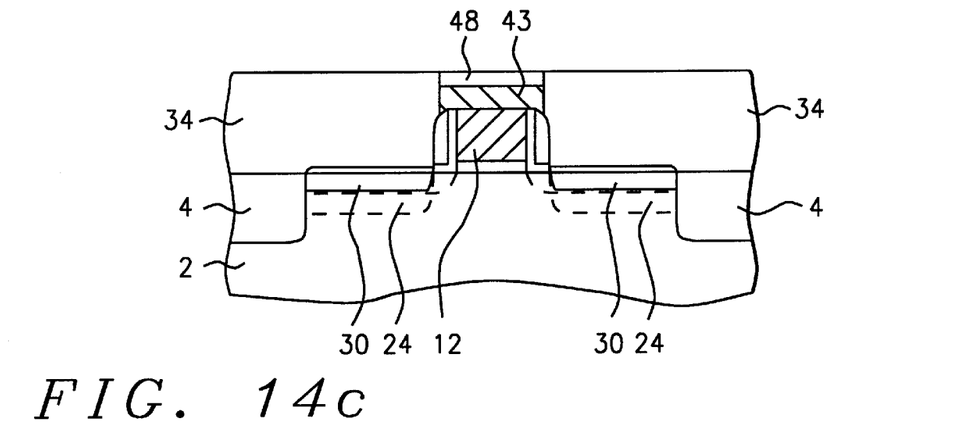

Referring now more particularly to FIGS. 14c and 14b, a second Ti/TiN or Cobalt/Titanium, Co/Ti, layer 46 is now deposited, in the same manner as the aforementioned first Ti/TiN layer 26, in preparation for the very first time that silicidation will take place on any polysilicon gate surface.

Figure 15A:
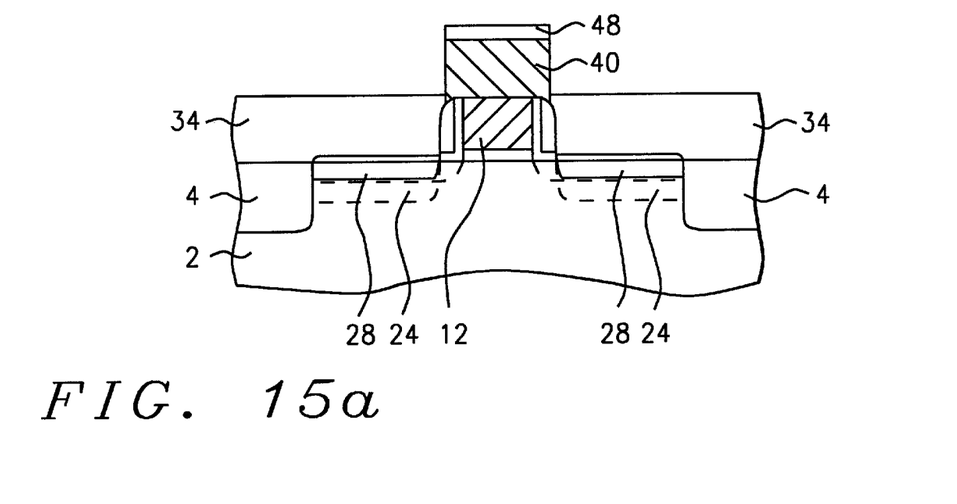
Figure 15B:
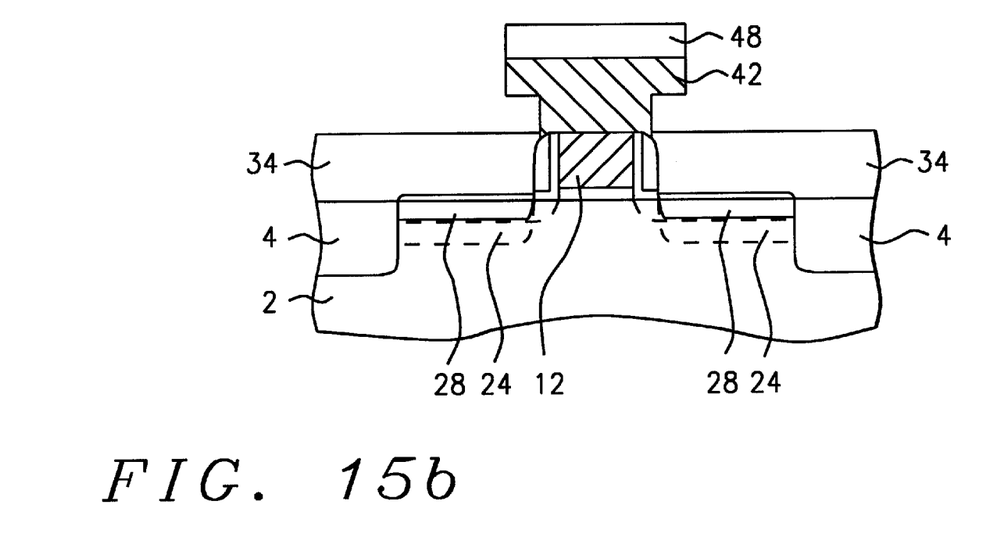

Referring now more particularly to FIGS. 15a and 15b, a layer of titanium or cobalt silicide 48 is formed by thermally reacting said second Ti/TiN of $CoSi_2$ layer 46 with the surfaces of said second polysilicon gates, 40 and 42, in a manner similar to that used for the aforementioned formation of titanium silicide in source-drain regions 28.

Said CMP related alternative preferred embodiment of said FIG. 12c will now be described up the same processing stage as that of said FIGS. 15a and 15b. Referring back to said FIG. 12c, it is recalled that said thick dielectric layer 32 was used as the CMP stopper for defining said second polysilicon gate feature 43 and that, therefore, in contrast to said preferred embodiments of said FIGS. 12a and 12b, said positive photoresist images 44 of said FIGS. 12a and 12b were not needed.

Figure 13C:
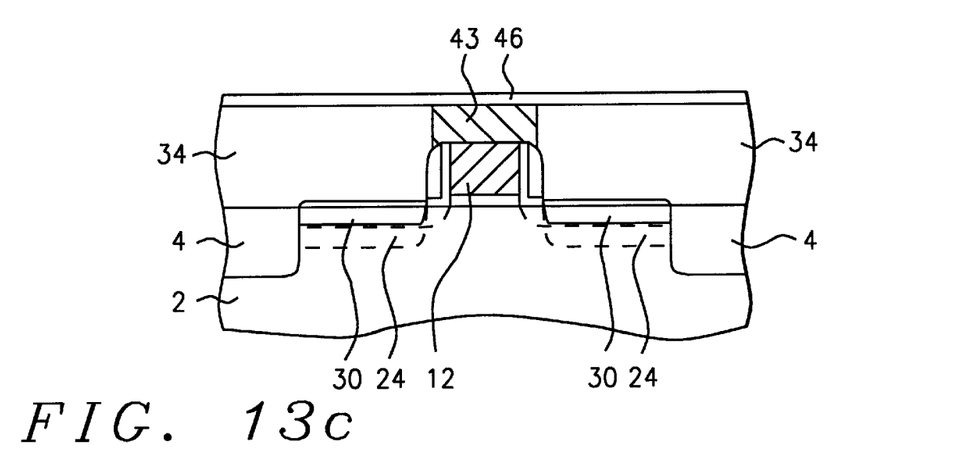

Referring now more particularly to FIG. 13c, the structure of FIG. 12c is shown with a second Ti/TiN or Co/Ti layer 46 which is deposited in the same manner as described for layer 46 (of FIGS. 14a and 14b) in the previously described preferred embodiments.

Referring now more particularly to FIG. 14c, the structure of FIG. 13c is annealed in order to form a layer of titanium or cobalt silicide in the same manner as described for layer 48 (of FIGS. 15a and 15b) in the previously described preferred embodiments.

Figure 16:
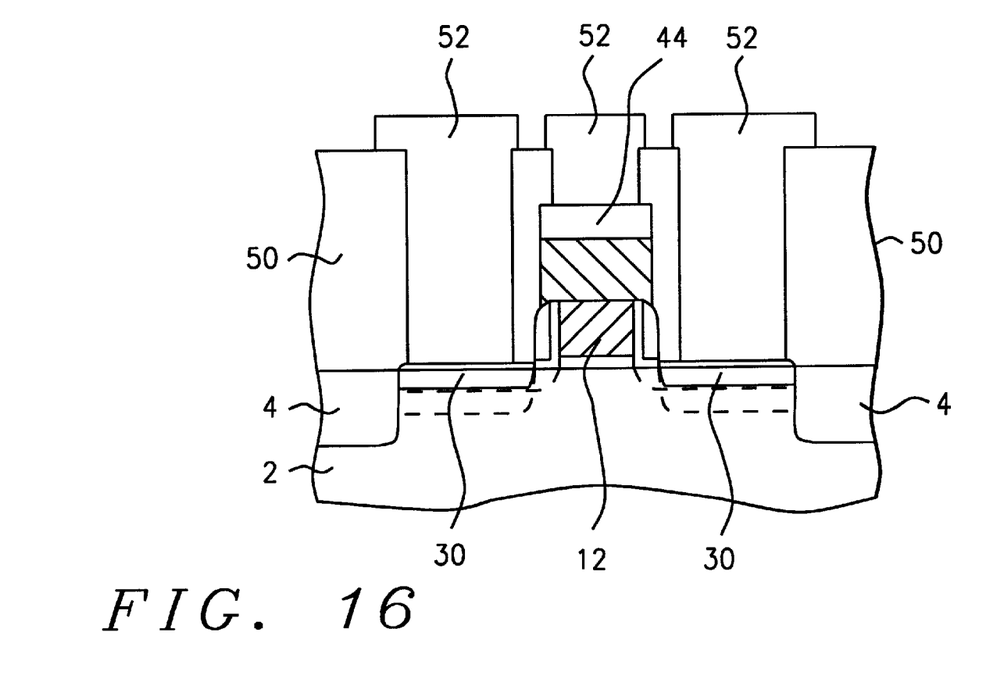

Said FIGS. 15a, 15b and 14c illustrate the three preferred embodiments of the present invention, where all three preferred embodiments are at the same stage of processing and ready for subsequent processing. The novel stages of the invention have now been described. For the sake of completion an example of the subsequent processing that would be needed to form any of the aforementioned three preferred embodiments into usable devices will now be briefly discussed for the case of the higher stud-shaped gate of FIG. 15a. Referring now more particularly to FIG. 16 for completion of a usable device, there is shown the subsequent deposition of an inter-level dielectric layer 50 along with the additional conventional processing needed to form contacting studs 52, down to the silicidated source-drain regions 30 as well as said silicidated gate regions 44. Although not illustrated for the case of the relatively larger T-shaped gate, more device area would be needed for the similar formation of contacting studs. By the same argument, the relatively larger T-shaped gates would require a greater spacing between neighboring devices. Consequently, although the T-shaped gate does provide additional lateral area for silicidation, and a slight associated reduction in stress, there is an extra chip area penalty. Therefore, the smaller stud-shaped polysilicon gate is preferred. For the case of the shorter of the two stud-shaped gate embodiments (also not shown), the reduced area for silicidation would tend to result in greater stress, in comparison to the relatively higher stud-shaped gate embodiment that was just discussed. However, the processing simplifications associated with the shorter stud-shaped gate electrode could still be quite beneficial from a manufacturing standpoint.

The objectives of the present invention have now been accomplished. By substantially increasing the vertical polysilicon gate area available for silicidation, the problem of high silicidation induced lateral stress has been drastically reduced, allowing for the fabrication of uniform titanium silicide on very narrow polysilicon gates. By only forming the titanium silicide up on the second polysilicon gate, the associated stresses have been safely located away from the active device. Consequently, the aforementioned voids issue is likely to be prevented due to the absence of fluorine from the $BF_2$ implant and lateral stress from the sidewall spacers. Furthermore, by using a nitride cap on top of the first polysilicon gate during nitride spacer etch, stresses from polymer stuffing of the, otherwise, exposed polysilicon surface grain boundaries have also been avoided. The additional contribution from the decoupling of the gate and the source/drain implants is likely to prevent the voids issue from occurring, particularly for the case of $BF_2$ doped polysilicon gates. The voids issue occurs primarily due to a thermally-driven fluorine precipitation effect which disrupts the TiSi$_2$ film formed on narrow polysilicon gates. By using a boron implant instead of BF$_2$ for the second polysilicon gate, this voids issue is totally avoided. Moreover, by using the preferred stud-shaped second polysilicon gate, high compatibility with shrinking design rules is achieved, along with additional savings from being able to use the same reticle for defining both the first and second polysilicon gate features.

While the invention has been particularly shown and described with reference to the preferred embodiments thereof, it will be understood by those skilled in the art that various changes in form and details may be made without departing from the spirit and scope of the invention.

What is claimed is:

1. A method for avoiding polysilicon gate processing-induced mechanical stress problems associated with the fabrication of narrow channel self-aligned-silicided (salicided) CMOS FET devices, comprising the steps of:
    a) forming a first insulating layer to protect surface of a first polysilicon gate, formed over a semiconductor substrate, during an anisotropic etching step for forming side wall spacers;
    b) using said first insulating layer to selectively prevent the formation of a silicide layer on the surface of said first polysilicon gate, while still forming a first silicide layer on active source-drain regions;
    c) forming a second polysilicon gate on top of said first polysilicon gate; and
    d) forming a second silicide layer on a surface of said second polysilicon gate.

2. The method of claim 1 wherein the thickness of said first insulating layer is between about 450 to 550 angstroms.

3. The method of claim 1 wherein the thickness of said first polysilicon gate is between about 1400 to 2500 angstroms.

4. The method of claim 1 wherein the thickness of said second polysilicon gate is between about 2000 to 3000 angstroms before a step of CMP and about 1000 to 1500 angstroms after a step of CMP.

5. The method of claim 1, wherein said anisotropic etching step for forming sidewall spacers is performed with a dry plasma process, such as RIE, Reactive Ion Etching.

6. The method of claim 1, wherein said second silicide layer is comprised of titanium silicide.

7. A fabrication method for minimizing mechanical stress in narrow channel self-aligned-silicided FET devices, comprising the steps of:
    a) depositing a first insulating layer over a first blanket polysilicon layer, formed over a semiconductor substrate, whereby said first insulating layer will temporarily remain after the first blanket polysilicon layer is etched to form first polysilicon gates;
    b) forming a second insulating layer over the substrate and etching said second insulating layer to form spacers on side walls of said first polysilicon gates, while said first insulating layer remains on the top surface of said first polysilicon gates;
    c) forming a first silicide layer on a surface of active source-drain regions, while using said first insulating layer to prevent silicide formation on the surface of said first polysilicon gates;
    d) depositing a second blanket polysilicon layer over said first polysilicon gates, to be subsequently planarized and used to form second polysilicon gates over said first polysilicon gates;
    e) etching the second blanket polysilicon layer for said second polysilicon gates and then forming a second silicide layer on said second polysilicon gates;
    f) depositing and planarizing a third insulating layer to be used as an inter-level dielectric.
    g) etching said interlevel dielectric to form first contact holes, down to the surface of said active source-drain regions and said second silicide layer; and
    h) forming contact studs in said first contact holes.

8. The method of claim 7, wherein said first insulating layer and said spacers are comprised of silicon nitride.

9. The method of claim 7, wherein refractory metals are used for forming said first and second silicide layers are comprised of materials selected from group consisting of Titanium, Molybdenum, Tantalum and Tungsten.

10. The method of claim 7, wherein said third insulating layer is a doped oxide layer formed by processes such as: LPCVD TEOS or SABPSG, Sub-Atmospheric BoroPhosilicate Glass.

11. The method of claim 7, wherein said second polysilicon gate is formed from either polysilicon or amorphous silicon.

12. The method of claim 7, wherein said inter-level dielectric is an oxide layer formed by a typical process such as LPCVD.

13. The method of claim 7, wherein planarizing said third insulating layer uses Chemical Mechanical Polishing, CMP.

14. The method of claim 7, wherein the thickness of said first polysilicon gates are controlled at a relatively thin value of about 1400 to 2500 angstroms.

15. The method of claim 7, wherein said second polysilicon gates are either in a shape of a relatively high stud, a relatively shallow stud or a T-shaped stud.

16. The method of claim 7, wherein the first and second silicide layers are formed by a two stage RTP anneal with an intervening selective chemical etch back.

17. The method of claim 15, wherein said relatively shallow stud shape is formed by using a pre-patterned underlying dielectric layer as a polish stopper, during the planarization of the associated second blanket polysilicon layer, by means of Chemical-Mechanical-Polishing, CMP.

18. The method of claim 15, wherein said relatively high stud shape is formed by using time as a relatively early polish stopper, during the planarization of the associated second blanket polysilicon layer, by means of CMP.

19. The method of claim 16, wherein said selective chemical etch back is comprised of a chemical mixture, such as: (1:1:5) ammonia peroxide, peroxide and DI water.

20. The method of claim 16, wherein a first RTP anneal Step is performed using a temperature range of about 720 to 750 degrees centigrade and for a time of about 30 to 60 seconds.

21. The method of claim 16, wherein a second RTP anneal is performed using a temperature range of about 820 to 850 degrees centigrade and for a time of about 10 to 30 seconds.

* * * * *